US011186941B2

(12) United States Patent
Puckett et al.

(10) Patent No.: US 11,186,941 B2
(45) Date of Patent: Nov. 30, 2021

(54) DUAL TUMBLE DRYER UNIT AND SYSTEM

(71) Applicant: GEL CAP TECHNOLOGIES, LLC, Ferndale, WA (US)

(72) Inventors: John Puckett, Custer, WA (US); Mark S. Lemna, Ferndale, WA (US)

(73) Assignee: Gel Cap Technologies, LLC, Ferndale, WA (US)

( * ) Notice: Subject to any disclaimer, the term of this patent is extended or adjusted under 35 U.S.C. 154(b) by 0 days.

(21) Appl. No.: 16/866,210

(22) Filed: May 4, 2020

(65) Prior Publication Data

US 2020/0333073 A1 Oct. 22, 2020

Related U.S. Application Data

(63) Continuation of application No. 15/990,199, filed on May 25, 2018, now Pat. No. 10,677,528, which is a (Continued)

(51) Int. Cl.
*D06F 58/02* (2006.01)
*A61J 3/07* (2006.01)
(Continued)

(52) U.S. Cl.
CPC ................ *D06F 58/02* (2013.01); *A61J 3/07* (2013.01); *F26B 5/00* (2013.01); *F26B 11/02* (2013.01);
(Continued)

(58) Field of Classification Search
CPC ........ F26B 11/02; F26B 5/00; F26B 11/0445; F26B 11/0436; D06F 58/02; H05K 999/99; A61J 3/07
(Continued)

(56) References Cited

U.S. PATENT DOCUMENTS 1,536,806 A * 5/1925 Merrill ................ F26B 11/0436 34/480
3,529,043 A * 9/1970 Chu .......................... A61J 3/07 264/15
(Continued)

FOREIGN PATENT DOCUMENTS

CA 2994122 A1 * 11/2014 ........... H05K 999/99
CA 2911968 C * 6/2018 ............. F26B 11/02
(Continued)

*Primary Examiner* — Stephen M Gravini
(74) *Attorney, Agent, or Firm* — FisherBroyles, LLP

(57) ABSTRACT

A dual tumble dryer unit that includes a housing that defines an interior, a divider that extends between first and second side walls and divides the interior into first and second sections, and first and second dryer assemblies that are positioned in the first and second sections. The first and second dryer assemblies each include a basket positioned to rotate about a horizontal axis, and a blower disposed positioned to blow air on the basket. A first drying path is defined between a first entry opening defined in the first side wall, the first basket and a first exit opening defined in the second side wall, and a second drying path is defined between a second entry opening defined in the first side wall, the second basket and a second exit opening defined in the second side wall.

10 Claims, 12 Drawing Sheets

Related U.S. Application Data continuation of application No. 15/470,769, filed on Mar. 27, 2017, now Pat. No. 10,001,322, which is a continuation of application No. 14/286,872, filed on May 23, 2014, now Pat. No. 9,638,464.

(60) Provisional application No. 61/826,891, filed on May 23, 2013.

(51) Int. Cl.

| | |
|---|---|
| ***F26B 11/04*** | (2006.01) |
| ***F26B 11/02*** | (2006.01) |
| ***F26B 5/00*** | (2006.01) |
| ***D06F 103/32*** | (2020.01) |
| ***D06F 105/32*** | (2020.01) |
| ***D06F 34/26*** | (2020.01) |
| ***D06F 58/38*** | (2020.01) |

(52) U.S. Cl.
CPC ...... *F26B 11/0436* (2013.01); *F26B 11/0445* (2013.01); *H05K 999/99* (2013.01); *D06F 34/26* (2020.02); *D06F 58/38* (2020.02); *D06F 2103/32* (2020.02); *D06F 2105/32* (2020.02)

(58) Field of Classification Search
USPC .............................................................. 34/499
See application file for complete search history.

(56) References Cited

U.S. PATENT DOCUMENTS

| | | | | | |
|---|---|---|---|---|---|
| 5,735,105 | A * | 4/1998 | Stroud | A61J 3/07 | 156/291 |
| 6,105,273 | A * | 8/2000 | Johanson | B01J 8/08 | 34/267 |
| 6,195,911 | B1 * | 3/2001 | Brehant | A23G 3/24 | 34/463 |
| 9,015,960 | B2 * | 4/2015 | Hopkin | F26B 9/02 | 34/417 |
| 9,638,464 | B2 * | 5/2017 | Puckett | F26B 11/02 | |
| 9,795,538 | B2 * | 10/2017 | Puckett | A61K 9/4808 | |
| 10,001,322 | B2 * | 6/2018 | Puckett | F26B 11/02 | |
| 10,677,528 | B2 * | 6/2020 | Puckett | F26B 11/0436 | |
| 2007/0289157 | A1 * | 12/2007 | Kim | F26B 11/00 | 34/201 |
| 2008/0000099 | A1 * | 1/2008 | Victorov | F26B 11/181 | 34/129 |
| 2020/0333073 | A1 * | 10/2020 | Puckett | D06F 58/02 | |

FOREIGN PATENT DOCUMENTS

| | | | | |
|---|---|---|---|---|
| GB | 2530205 B | * | 11/2018 | F26B 11/02 |
| GB | 2563167 A | * | 12/2018 | F26B 11/0436 |
| WO | WO-2014190320 A1 | * | 11/2014 | F26B 11/0436 |

* cited by examiner

ZONE 2

DUAL TUMBLE DRYER UNIT AND SYSTEM

CROSS REFERENCE TO RELATED APPLICATIONS

This application is a continuation of U.S. patent application Ser. No. 15/990,199, filed May 25, 2018, which is a continuation of U.S. patent application Ser. No. 15/470,769, filed Mar. 27, 2017, now U.S. Pat. No. 10,001,322, which is a continuation of U.S. patent application Ser. No. 14/286,872, filed May 23, 2014, now U.S. Pat. No. 9,638,464, issued May 2, 2017, which claims the benefit of U.S. Provisional Application No. 61/826,891, filed May 23, 2013, each of which is incorporated herein by reference in its entirety.

FIELD OF THE INVENTION

The present invention relates to a gelatin capsule manufacturing and drying system that includes tumblers or dryers with two drying units.

BACKGROUND OF THE INVENTION

The gelatin capsule or softgel is a one-piece, hermetically sealed soft gelatin shell containing a liquid, a suspension, or a semi-solid. One challenge for softgel manufacturers is the length of time it takes to dry the shell to a hardness where the softgel can be packaged. Many softgel manufacturers utilize pre-drying units, then spread the capsules onto trays and place the trays into drying tunnels. Once the product is put into the drying tunnels, it can take up to seven days to complete drying of the shell. Shorter drying times and higher volume are desirable. A dryer/tumbler within the system that can supply shorter drying times and higher volume is desirable. See also U.S. Pat. No. 8,621,764, the entirety of which is incorporated herein by reference.

SUMMARY OF THE PREFERRED EMBODIMENTS

In accordance with a first aspect of the present invention there is provided a dual tumble dryer unit that includes a housing having a top, a bottom, first and second opposing end walls and first and second opposing side walls that cooperate to define a housing interior. The housing includes a divider that extends between the first and second side walls and divides the housing interior into first and second sections. The unit includes a first dryer assembly positioned in the first section having a first basket positioned to rotate about a first horizontal axis, and a first blower disposed in the first section and positioned to blow air on the first basket. The unit also includes a second dryer assembly positioned in the second section having a second basket positioned to rotate about a second horizontal axis, and a second blower disposed in the second section and positioned to blow air on the second basket. A first drying path is defined between a first entry opening defined in the first side wall, the first basket and a first exit opening defined in the second side wall, and a second drying path is defined between a second entry opening defined in the first side wall, the second basket and a second exit opening defined in the second side wall.

In a preferred embodiment, the first drying path extends generally parallel to the first horizontal axis, the second drying path extends generally parallel to the second horizontal axis, and the first and second horizontal axes are generally parallel to one another. Preferably, the first dryer assembly includes a first ramp that is positioned to direct air from the blower onto the first basket, and the second dryer assembly includes a second ramp that is positioned to direct air from the blower onto the second basket. In a preferred embodiment, the second dryer assembly is essentially a mirror image of the first dryer assembly. As a result, the first blower is configured to blow air in a first direction, the second blower is configured to blow air in a second direction, and the first direction is opposite the second direction.

In a preferred embodiment, the housing includes first and second covers secured thereto by first and second hinges, respectively. The first and second covers cover the first and second sections. Preferably, the first hinge is located adjacent the second hinge such that the first and second covers open in an opposed manner.

In accordance with another aspect of the present invention there is provided a method of at least partially drying first and second softgels that includes providing a dual tumble dryer unit similar to the one described above, moving the first softgel through a first drying path, and moving the second softgel through a second drying path at the same time that the first softgel is moved through the first drying path.

In accordance with another aspect of the present invention there is provided a gelatin capsule drying system that includes a structure divided into first, second and third zones, a first air handler unit positioned to discharge air into the first zone, a second air handler unit positioned to discharge air into the second zone and a third air handler unit positioned to discharge air into the third zone. The first zone includes a first temperature sensor, the second zone includes a second temperature sensor, and the third zone includes a third temperature sensor. The first air handler unit is in communication with the first temperature sensor, the second air handler unit is in communication with the second temperature sensor, and the third air handler unit is in communication with the third temperature sensor. The system further includes a series of dual tumble dryers units that extend from the first zone, through the second zone and into the third zone, and an HVAC unit that provides air to the first, second and third air handler units.

In a preferred embodiment, the series of dual tumble dryer units includes at least first, second and third dual tumble dryer units, which are each positioned in one of the first, second and third zones, respectively. Preferably, the HVAC unit provides air to the first, second and third air handler units at a first condition and the first, second and third air handler units are controlled independently of the HVAC unit. Preferably the first air handler unit releases air into the first zone at a second condition, the second air handler unit releases air into the second zone at a third condition, and the third air handler unit releases air into the third zone at a fourth condition. In an embodiment, the series of dual tumble dryers units includes multiple dual tumble dryers units in the first zone, multiple dual tumble dryers units in the second zone, and multiple dual tumble dryers units in the third zone.

As will be appreciated by those of ordinary skill in the art, the purpose of the tumble dryer is to move gelcaps or softgels through an environmental system. In a preferred embodiment, the tumble dryer system includes fifteen tumble dryer. The tumble dryers are filled from one end and are then tumbled for a desired time after which the tumbler reverses and causes the gelcaps to dump into the next tumble dryer. This process continues until the gelcaps pass through the entire line of tumble dryers. After the fifteenth tumble dryer, the gelcaps are dumped into a portable bin and are ready for bulk packaging or bottling.

In a preferred embodiment, each tumble dryer includes two tumbler baskets and blowers. Each basket is a wire mesh cylinder wrapped with a chain at one end. The chain is driven by a sprocket that is fixed to the inside of the housing of the tumble dryer. This sprocket is driven by a second chain that receives power from an electric motor and gearbox. In a preferred embodiment, the housing is constructed of machined aluminum and skinned with stainless steel sheeting. However, this is only exemplary and the components can be made of other materials. The housing contains two blower fans mounted at the bottom thereof. Preferably, the housing is capped with a pair of stainless steel hinged lid.

In a preferred embodiment, the tumbler baskets are constructed of aluminum rings spaced with stainless steel mesh and reinforced with ¾" stainless steel rods. The aluminum rings are capped with UHMW discs. In a preferred embodiment, the electronics are all solid state and UL listed. In a preferred embodiment, the system is programmed through a PLC computer system or the like.

As discussed above, in a preferred embodiment, each tumbler includes two units, which provides the ability to run two separate runs of gelcaps through the same environmental system. In a preferred embodiment, the system can be controlled and communicated with from an off-site location.

In an exemplary embodiment, the dual inline-dryers can accommodate a 3%-5% weight gain of the external shell applied from enteric coating softgel products, the negative pressure within the dryer housing is between about −10,000 and about −5,000 cfm, the air flow rate is between about 8500 and about 17,000 m3/per hr. In an exemplary embodiment, the dilution of the enteric coating: 3% to 5% weight gain on top of product, 15% to 20% opadry solids, remaining liquids. The temperature is between about 90 degrees and 130 degrees Fahrenheit. In an exemplary embodiment, about 15,000 to 25,000 softgels can be coated and dried simultaneously.

The invention, together with additional features and advantages thereof, may be best understood by reference to the following description.

BRIEF DESCRIPTION OF THE DRAWINGS

Like numerals refer to like parts throughout the several views of the drawings.

DETAILED DESCRIPTION OF THE PREFERRED EMBODIMENTS

Figure 1:
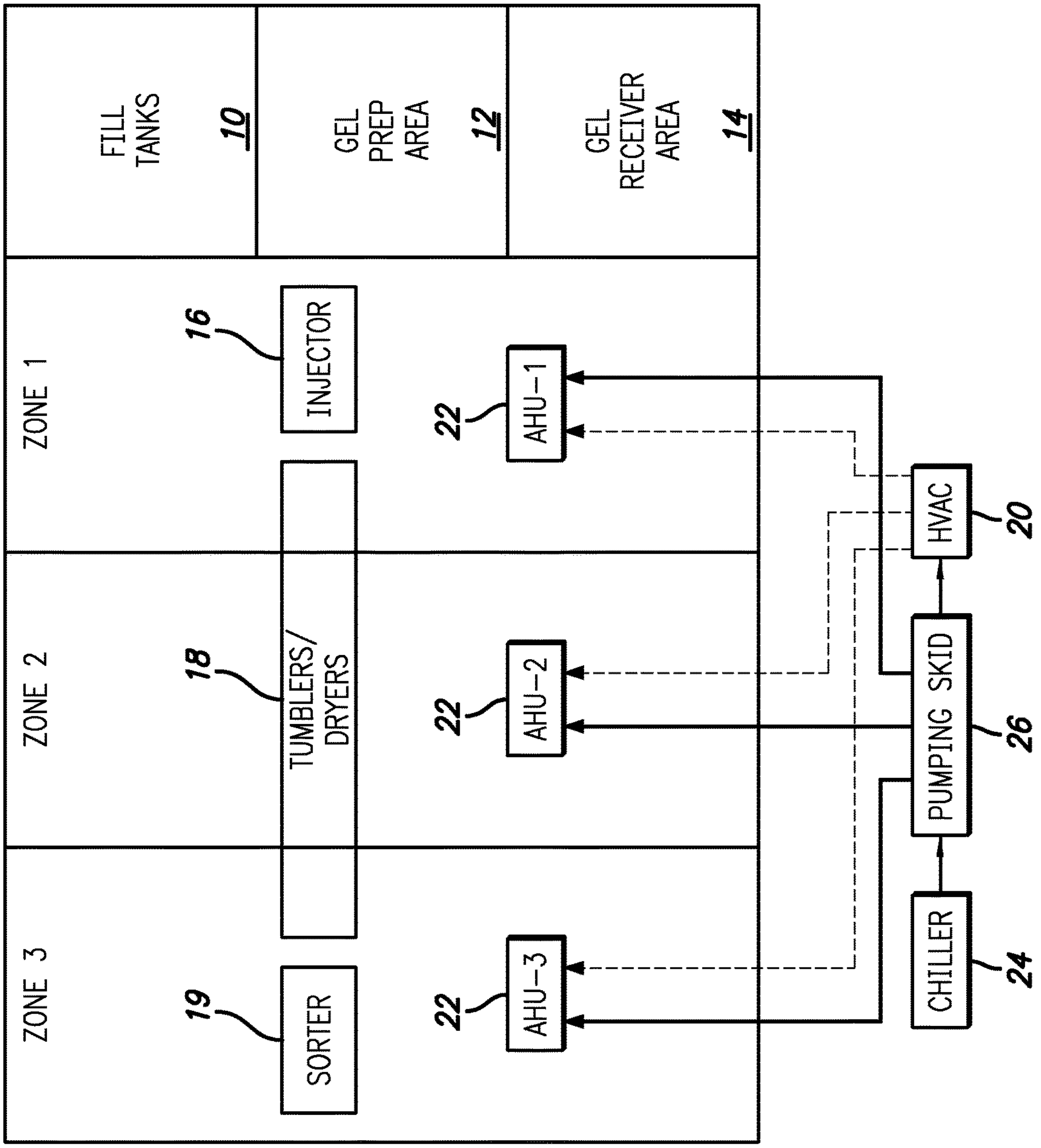
FIG. 1 is a schematic showing a three zone drying system in accordance with a preferred embodiment of the present invention.
Figure 2:
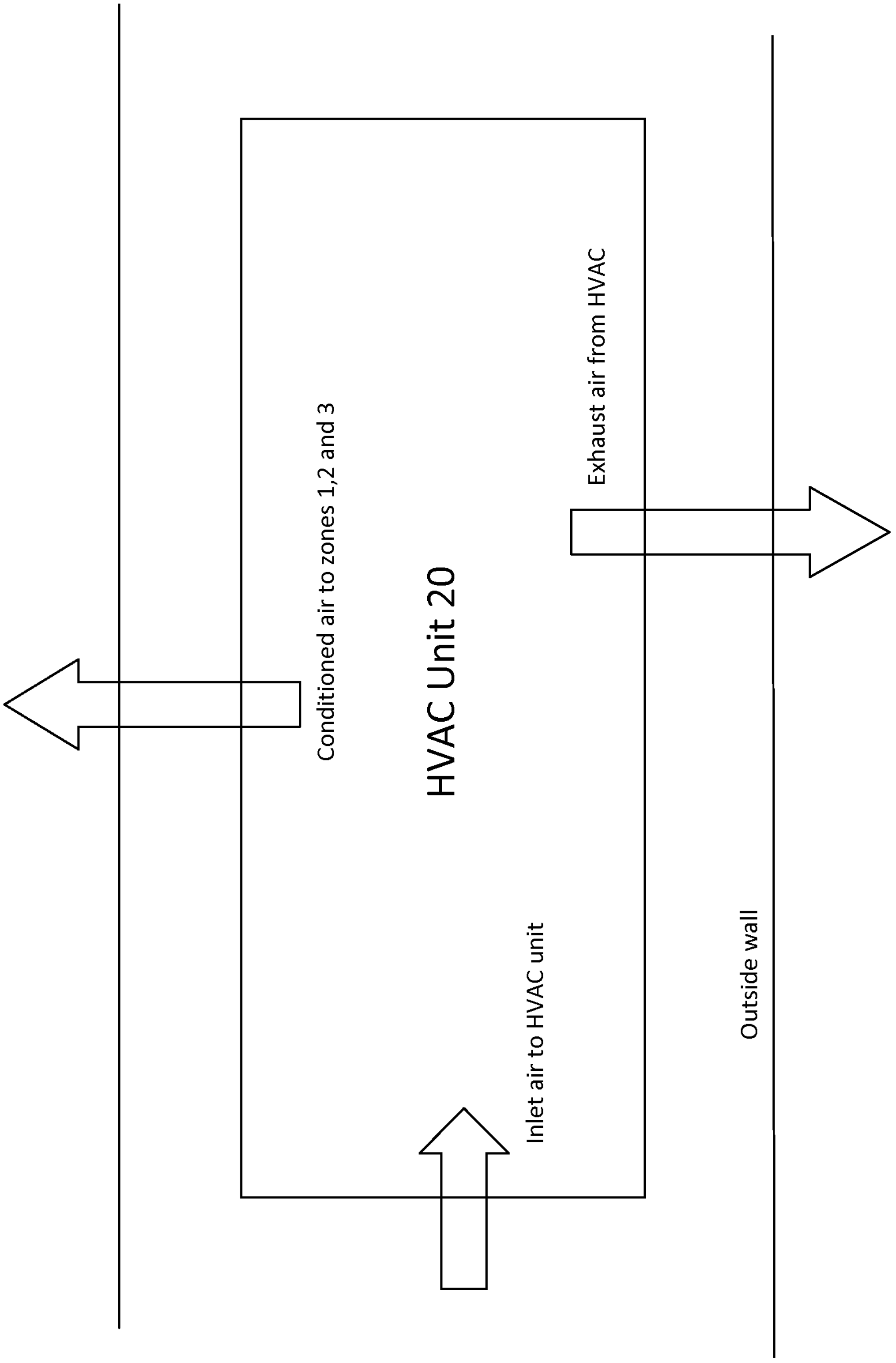
FIG. 2 is a schematic showing the HVAC unit of the drying system of FIG. 1.

The following description and drawings are illustrative and are not to be construed as limiting. Numerous specific details are described to provide a thorough understanding of the disclosure. However, in certain instances, well-known or conventional details are not described in order to avoid obscuring the description. References to one or another embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. Appearances of the phrase "in one embodiment" in various places in the specification do not necessarily refer to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks: The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

It will be appreciated that terms such as "front," "back," "top," "bottom," "side," "short," "long," "up," "down," and "below" used herein are merely for ease of description and refer to the orientation of the components as shown in the figures. It should be understood that any orientation of the components described herein is within the scope of the present invention.

Referring now to the drawings, wherein the showings are for purposes of illustrating the present invention and not for purposes of limiting the same, FIGS. 1-8 show in block diagram form a softgel drying system in accordance with a preferred embodiment of the present invention. It should be understood that the process described and shown herein is described as performed within a manufacturing warehouse/building. This is done for illustrative purposes only and for ease of understanding and is not considered limiting in any way.

As can be seen from the block layout in FIG. 1, the building includes an area for fill tanks 10, a gel prep area 12 and a gel receiver area 14. These areas can be within the same room or in separate rooms. The building also includes three separate zones/rooms in which the drying process occurs (described below). Each zone is also supplied with sensors for monitoring temperature and humidity, among other conditions. The system includes a dehumidifier/HVAC unit 20, chiller 24, control panels for controlling the conditions of each of the zones, ducting, water lines, electrical schematics, and three air handler units 22. Each air handler unit 22 is capable of cooling and heating within each zone.

Generally, the softgels are manufactured according to the following process: 1. The product is transferred from bulk storage to the fill tanks 10 where the product is agitated continuously. 2. In the gel prep area 12, raw gelatin is placed in a gel prep tank/reactor and is liquefied. 3. The gelatin is aged in the gel receiver area 14. 4. The fill product is encapsulated in a capsule injector 16, thereby forming a softgel. 5. The softgels are cured as they are processed through a series of tumble dryers 18. 6. A sorter 19 sorts and removes defective softgels. In an exemplary embodiment, the inventor has found that softgels can be dried to a hardness of eight newtons in about thirteen hours. A 1000 mg capsule can be dried to a desired level in under 12 hours.

The softgels are generally prepared by encapsulating a medicated fill in a gelatin shell. The shells and fills are prepared according to formulations well known to those of skill in the art. Accordingly, the system and process set forth above can be used for drying any softgel. However, in a preferred embodiment, the system is used to dry softgels having a desired formula and steps for preparation. An exemplary batch for the preferred gelatin formulation is 219.0 kg of gelatin 150 bloom, 110.0 kg of glycerin 99.5%, and 172.5 kg of purified water and 6.5 kg of caramel color. In a preferred embodiment, the softgels include between about 37% and about 41% 150 bloom bovine gelatin, between about 17% and about 21% glycerine and between about 25% and about 29% water.

In a preferred embodiment, the process for making the softgel shell (step 2 above) includes the following steps: Pre-weigh all raw materials into clean containers. Add glycerin and purified water to the gelatin melter (which is set in an exemplary embodiment to 176° F.). Turn on the mixer and leave mixing. Once the mixer reaches about 176° F. add the pre-weighed raw gelatin. Apply vacuum to allow the liquids to rise and saturate the gelatin. Turn off the vacuum, but leave the tank sealed with the vacuum. Leave on the mixer/agitator and allow the gelatin to mix for 30 minutes. Deaerate the gelatin. Leave the vacuum valve on the gelatin melter closed to seal the vacuum and turn off the vacuum pump. Allow the gelatin to mix under sealed vacuum for 10 minutes at slow mixing speed, or until the temperature is between about 149° F. to about 158° F.

Step 5 above (the softgels are cured as they are processed through a series of tumble dryers 18) will now be described in more detail. During the process, the softgels pass through the series of tumble dryers 18 (also referred to herein as a tumble drying line 18) that reside in and span three separate air conditioning zones or rooms (labeled zone 1, zone 2 and zone 3 in the figures). It will be appreciated that there could be as few as three tumble dryers; one in each zone. In a preferred embodiment, the zones are separate rooms that are separated by walls or other partitions. However, in another embodiment, the zones can be all located within the same room or space.

Preferably, each zone is maintained at a predetermined temperature and relative humidity condition. The preferred equipment for maintaining the zones at the desired temperature and humidity and providing the desired air flow within each zone is described below. Generally, in zone 1, the ambient temperature is kept cool to allow the softgel to set immediately after conception. In zone 2, the temperature is set higher than zone 1 so that it drives out the moisture in the softgel shell and the humidity is lower than zone 1 to help the moisture evaporate from the softgel in a timely manner. In zone 3, the conditions again change to allow the softgel a slower drying process for the remaining moisture to evaporate from the shell.

In a preferred embodiment, the temperature in zone 1 is between about 50° F. and about 68° F. In a more preferred embodiment, the temperature in zone 1 is between about 59° F. and about 61° F. In the most preferred embodiment, the temperature in zone 1 is about 60° F. In a preferred embodiment, the relative humidity in zone 1 is between about 19% and about 23%. In a more preferred embodiment, the relative humidity in zone 1 is between about 20.5% and about 21.5%. In the most preferred embodiment, the relative humidity in zone 1 is about 21%. In a preferred embodiment, the dew point in zone 1 is between about 15° F. and about 30° F. In a more preferred embodiment, the dew point in zone 1 is between about 24° F. and about 26° F. In the most preferred embodiment, the dew point in zone 1 is about 25° F.

In a preferred embodiment, the temperature in zone 2 is between about 72° F. and about 87° F. In a more preferred embodiment, the temperature in zone 2 is between about 81° F. and about 83° F. In the most preferred embodiment, the temperature in zone 2 is about 82° F. In a preferred embodiment, the relative humidity in zone 2 is between about 9% and about 14%. In a more preferred embodiment, the relative humidity in zone 2 is between about 10.5% and about 11.5%. In the most preferred embodiment, the relative humidity in zone 2 is about 11%. In a preferred embodiment, the dew point in zone 2 is between about 15° F. and about 23° F. In a more preferred embodiment, the dew point in zone 2 is between about 19° F. and about 21° F. In the most preferred embodiment, the dew point in zone 2 is about 20° F.

In a preferred embodiment, the temperature in zone 3 is between about 68° F. and about 74° F. In a more preferred embodiment, the temperature in zone 3 is between about 71° F. and about 73° F. In the most preferred embodiment, the temperature in zone 3 is about 72° F. In a preferred embodiment, the relative humidity in zone 3 is between about 10% and about 15%. In a more preferred embodiment, the relative humidity in zone 3 is between about 12.5% and about 13.5%. In the most preferred embodiment, the relative humidity in zone 3 is about 13%. In a preferred embodiment, the dew point in zone 3 is between about 15° F. and about 23° F. In a more preferred embodiment, the dew point in zone 3 is between about 19° F. and about 21° F. In the most preferred embodiment, the dew point in zone 3 is about 20° F.

It should be understood that the temperatures and humidities set forth above are preferred for the particular gelatin capsule formulation set forth above and can vary for other formulations based on a variety of factors, such as the gelatin formulation and/or the fill formulation.

The temperature, humidity and dew point conditions set forth above are provided by an HVAC unit 20 together with an air handler unit 22 within each zone. As can be seen in FIG. 1, in a preferred embodiment, the HVAC unit 20, provides conditioned air to the air handler unit 22 within each zone. The air is conditioned by the air handler unit 22 after it leaves the HVAC unit 20 and prior to entering each zone/room atmosphere. Within each zone, the resident air handler unit 22 is capable of adjusting the temperature, dew point and humidity of the air prior to its release into the air/room atmosphere.

It will be appreciated by those skilled in the art that the air handler units 22 blow the conditioned air over the softgels as they move through the tumbler drying line 18. Cubic feet per minute (CFM) is a standard measurement of airflow indicating how many cubic feet of air pass a point in one minute. In a preferred embodiment, the zone 1 air handler unit 22 outputs air at between about 3000 CFM and about 6000 CFM. In a more preferred embodiment, the zone 1 air handler unit 22 outputs air at about 4000 CFM and about 5000 CFM. In the most preferred embodiment, the zone 1 air handler unit 22 outputs air at about 4500 CFM to about 4700 CFM. In a preferred embodiment, the zone 2 air handler unit 22 outputs air at between about 2500 CFM and about 5000 CFM. In a more preferred embodiment, the zone 2 air handler unit 22 outputs air at about 3000 CFM and about 4500 CFM. In the most preferred embodiment, the zone 2 air handler unit 22 outputs air at about 3900 CFM to about 4100 CFM. In a preferred embodiment, the zone 3 air handler unit 22 outputs air at between about 1000 CFM and about 3000 CFM. In a more preferred embodiment, the zone 3 air handler unit 22 outputs air at about 1500 CFM and about 2500 CFM. In the most preferred embodiment, the zone 3 air handler unit 22 outputs air at about 2100 CFM to about 2300 CFM.

Figure 3:
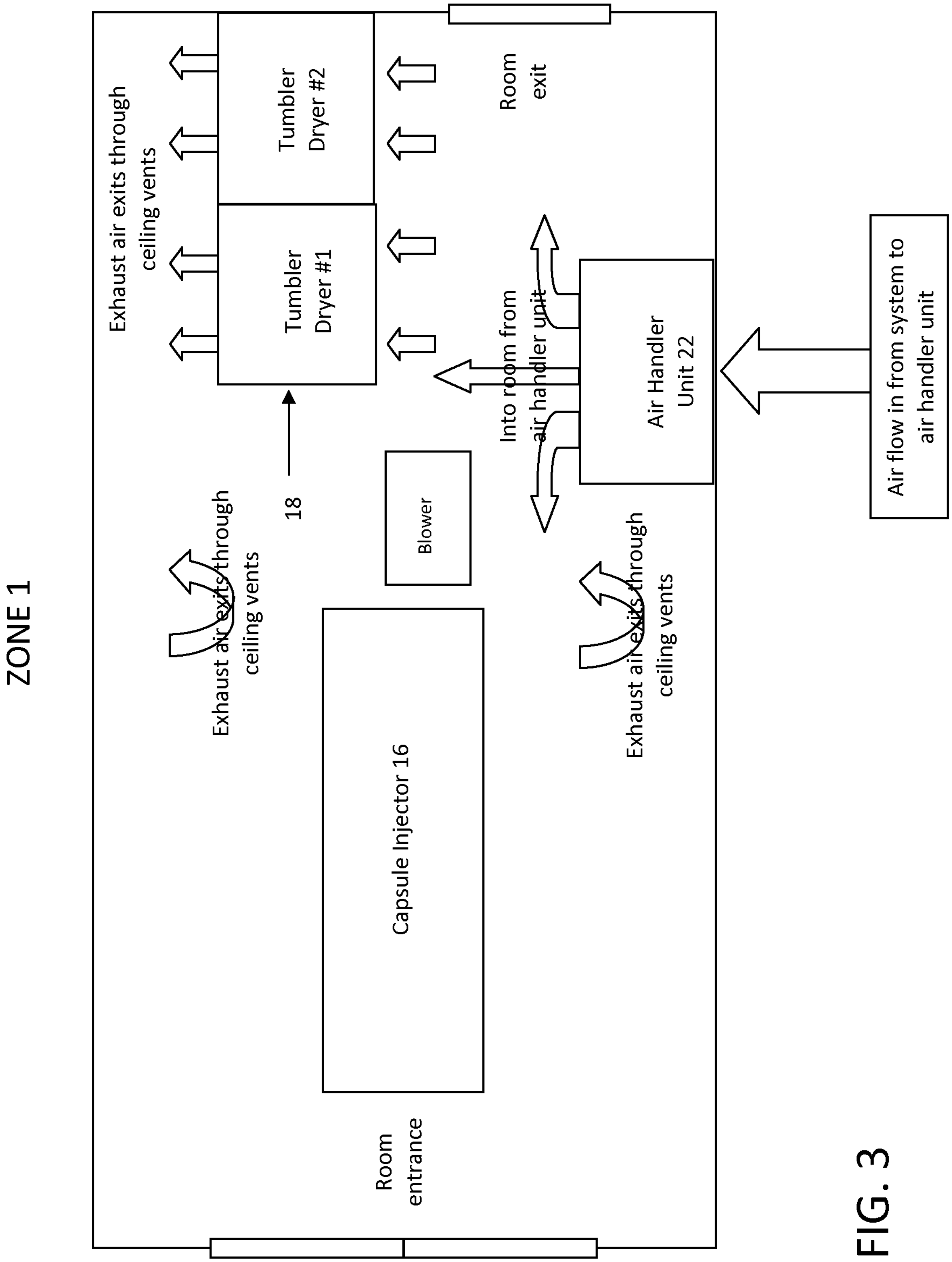
FIG. 3 is a schematic of zone 1 of the drying system of FIG. 1.
Figure 5:
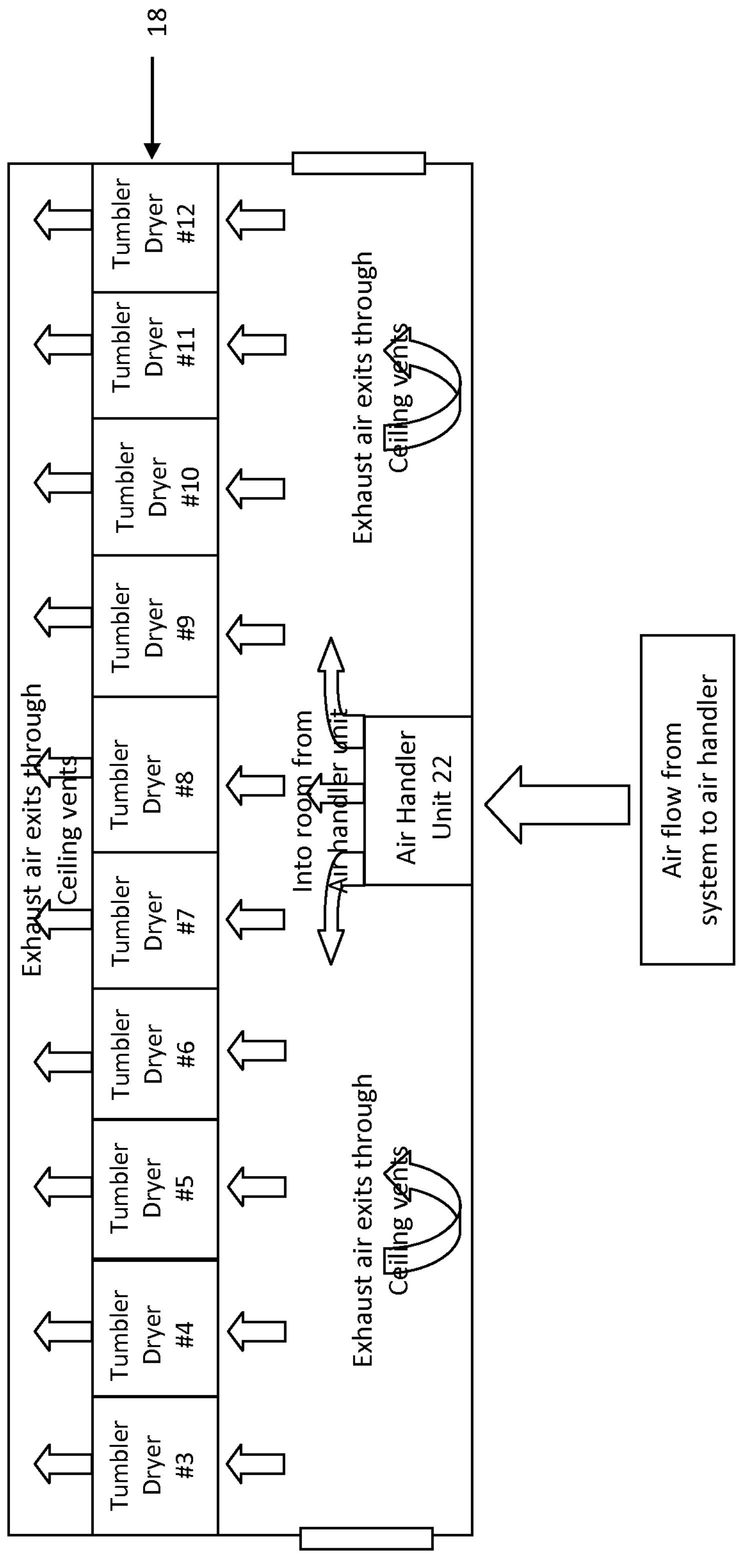
FIG. 5 is a schematic of zone 2 of the drying system of FIG. 1.
Figure 7:
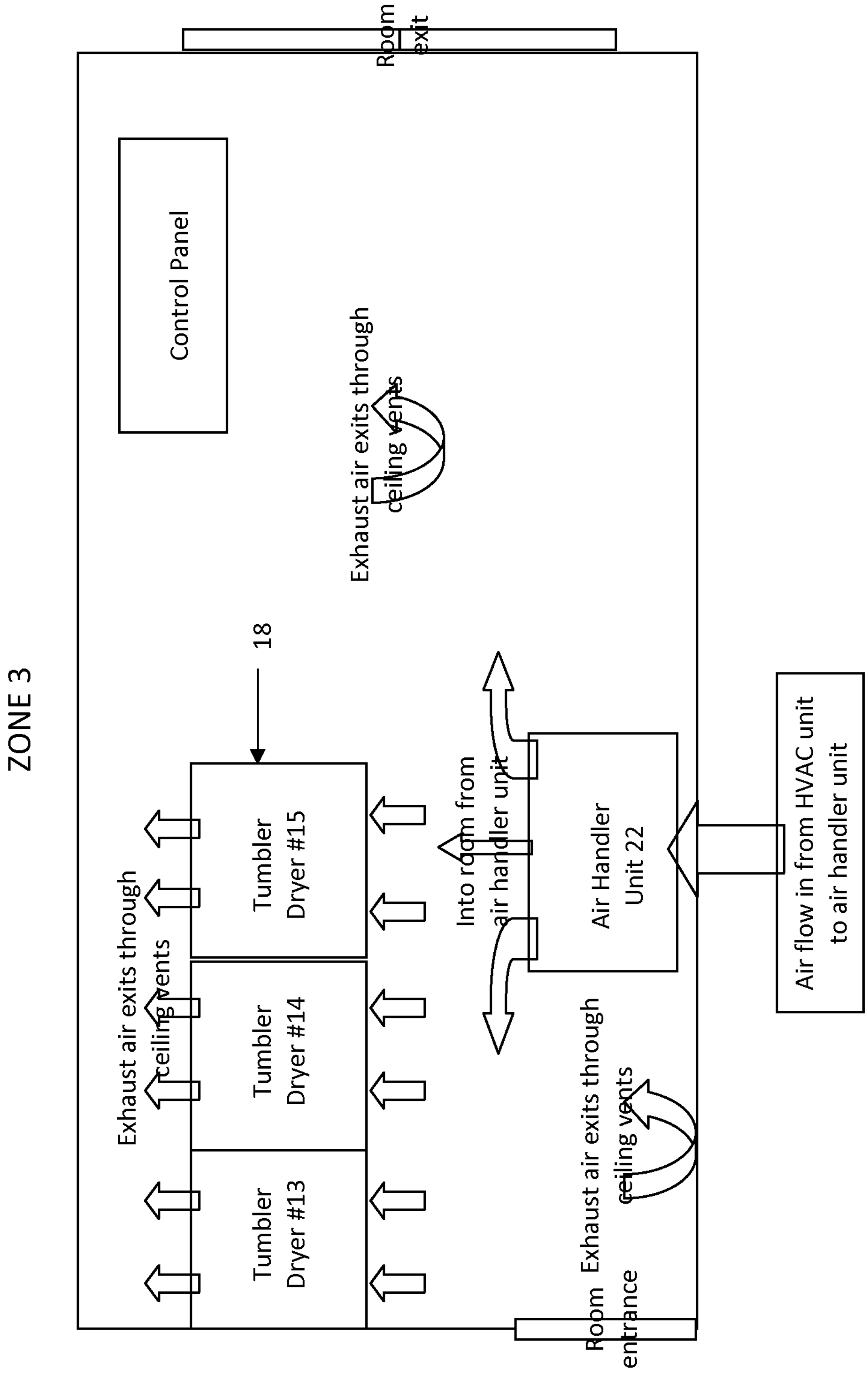
FIG. 7 is a schematic of zone 3 of the drying system of FIG. 1.

FIGS. 3, 5 and 7 show the location of the air handler units 22, tumble drying line 18 and other components within each zone. The components shown in these figures are generally positioned or mounted on the floor of the zone. In the exemplary embodiment, the system includes two tumble dryers in zone 1, ten tumble dryers in zone 2 and three tumble dryers in zone 3, for a total of fifteen tumble dryers. However, it will be appreciated by those skilled in the art that any number of tumble dryers can be located within each zone. It will be understood that as the softgels pass through the various tumble dryers 18, air from the air handler unit 22 within the zone is blown over the softgels.

Figure 4:
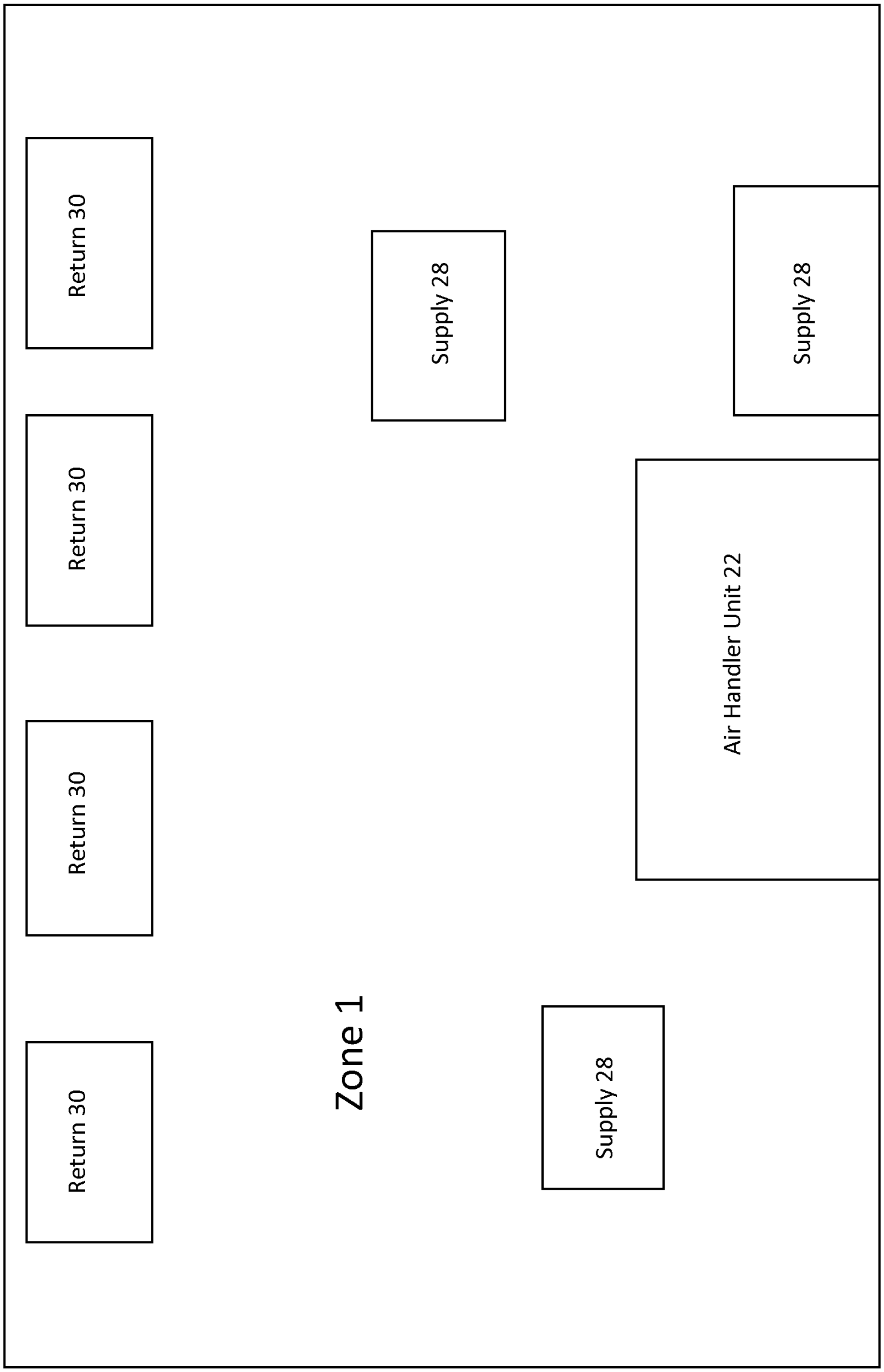
FIG. 4 is a schematic of the ducting system of zone 1 of the drying system of FIG. 1.
Figure 6:
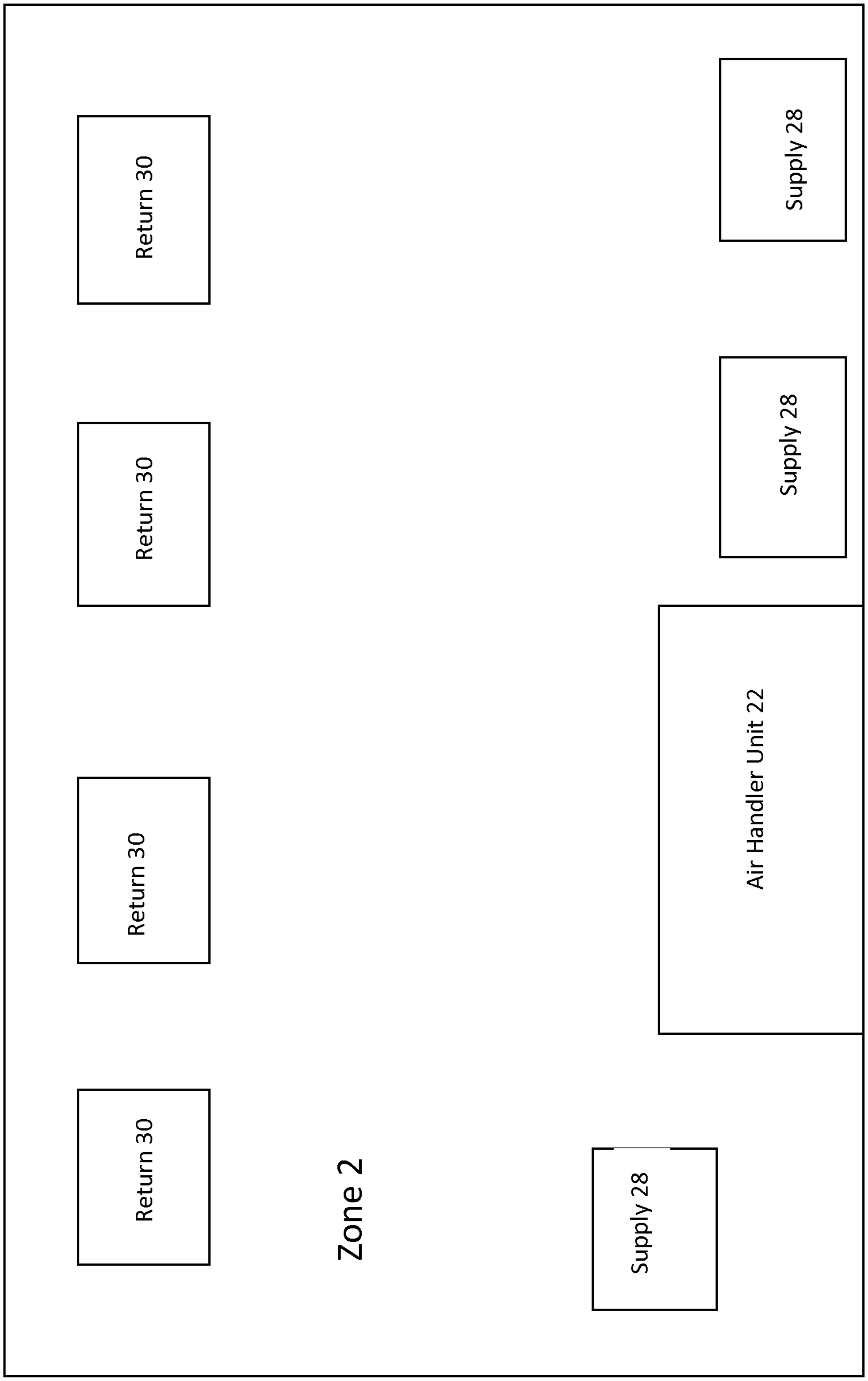
FIG. 6 is a schematic of the ducting system of zone 2 of the drying system of FIG. 1.
Figure 8:
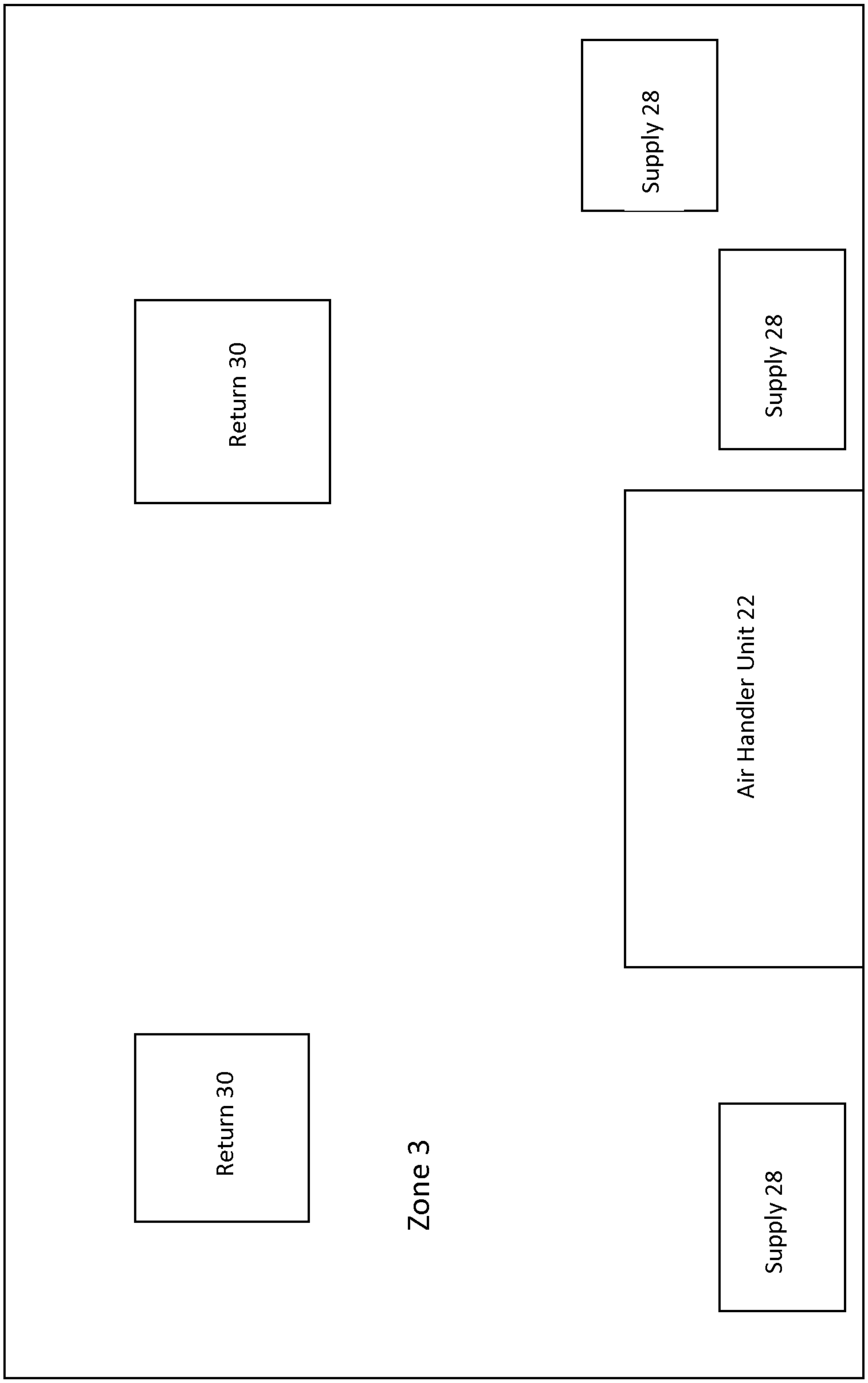
FIG. 8 is a schematic of the ducting system of zone 3 of the drying system of FIG. 1.

FIGS. 4, 6 and 8 show the air handler unit 22 within each zone together with the location of the supply and exhaust/return vents 28 and 30. It will be understood that the supply and exhaust vents 28 and 30 are located within ducting that is located at the top of each zone. In another embodiment, the ducting can be located in other portions of the zones (e.g., along the floor). In FIGS. 4, 6 and 8, the supply vent 28 closest to the air handler unit 22 ducts air directly to the air handler unit. The other two supply vents 30 supply air directly to the zone. The number of supply and exhaust/return vents 28 and 30 is not a limitation on the present invention. Any number of supply or exhaust/return vents are within the scope of the invention.

In an exemplary embodiment, the HVAC unit 20 is a Bry-Air® Dehumidifier model VFB 150 that provides up to 16,500 CFM of process air at between about 68° F. to about 75° F. and between about 8% and about 14% relative humidity and at a dew point of between about 13° F. and about 18° F. In a preferred embodiment, at least some of the process air from the HVAC unit is routed to the air handler units 22. Within each zone, the air handler unit 22 checks (via sensors) temperature, humidity, and dew point. Within the air handler unit 22, the air is adjusted or conditioned so that it is at the desired temperature, humidity, and dew point and then it is released into the zone/room. In an exemplary embodiment, the air handler units 22 are Canatal® air handler units that provide recirculation airflow within each zone to help prevent stagnant/stratification areas with each zone. The air handler units 22 each include a blower, heater and chiller therein for providing the desired air conditions and the desired air flow. As is described above, in a preferred embodiment, the air handler unit 22 in zone 1 is more powerful than the air handler units in zones 2 and 3. However, this is not a limitation on the present invention.

In a preferred embodiment, the system includes a chiller 24 and pumping skid 26 that together provide cooled water to the HVAC unit 20 and air handler units 22 to help cool the process air as desired. In an exemplary embodiment, the chiller 24 is a Carrier® chiller that provides chilled water at about 45° F. that is piped to the pumping skid 26. In an exemplary embodiment, the pumping skid 26 includes two chilled water pumps with a chilled water storage tank. The pumps circulate the chilled water to chilled water coils in the HVAC unit 20 and each zone air handler unit 22. In FIG. 1, the water supply is represented by the arrows with solid lines and the air supply is represented by the arrows with dashed lines. The chilled water helps each air handler unit 22 to condition the air as desired and as detailed above.

Figure 9:
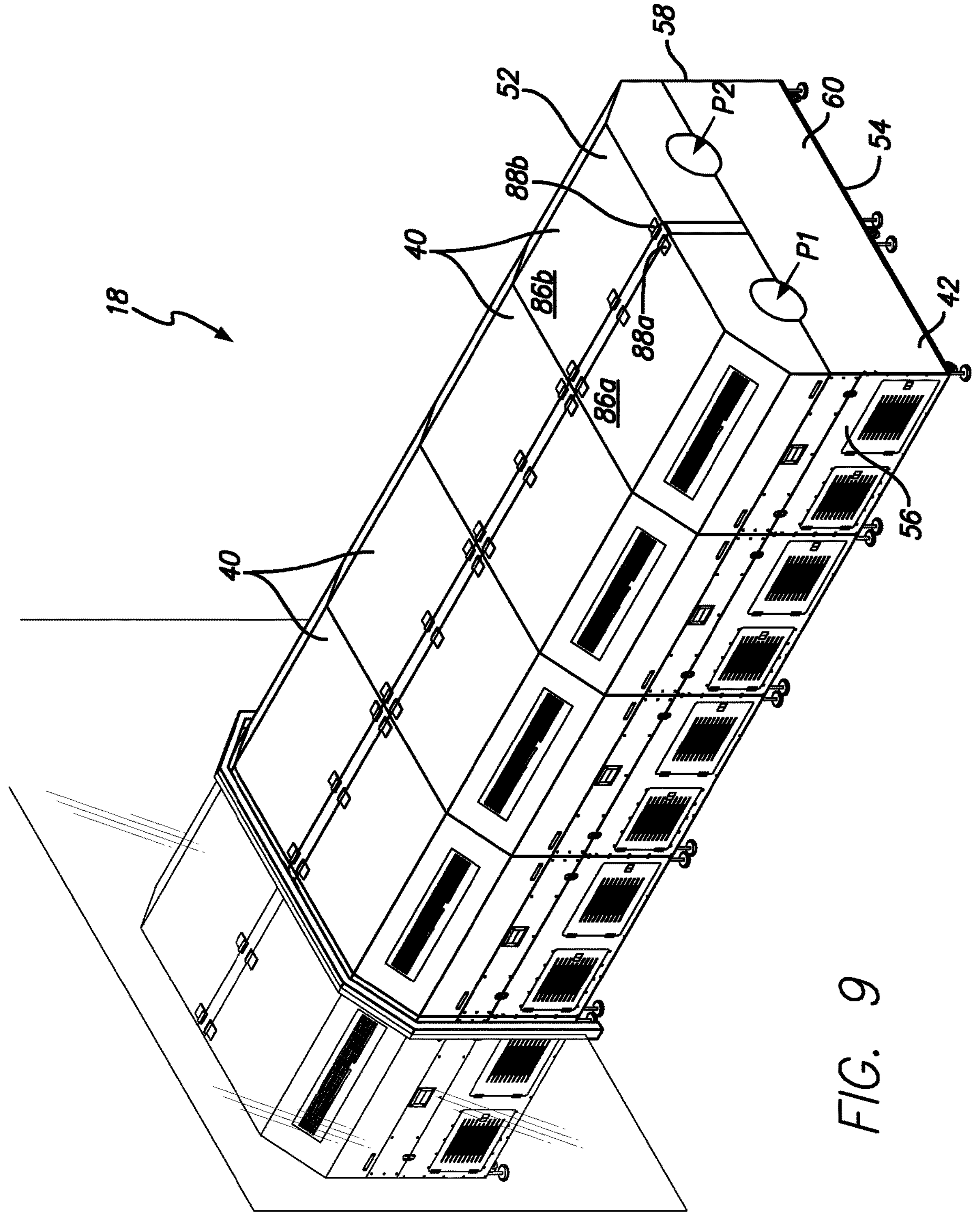
FIG. 9 is a perspective view of a series of dual tumble dryer units extending between zones 2 and 3 in accordance with a preferred embodiment of the present invention.

FIGS. 9-12 show a preferred embodiment of a tumble dryer unit 40 and tumble dryer line 18. As discussed above, and as shown in FIG. 9, in a preferred embodiment, the system includes a plurality (e.g., fifteen) tumble dryers 40. FIG. 9 shows the line of tumble dryer line 18 extending from zone 1 into zone 2.

Figure 10:
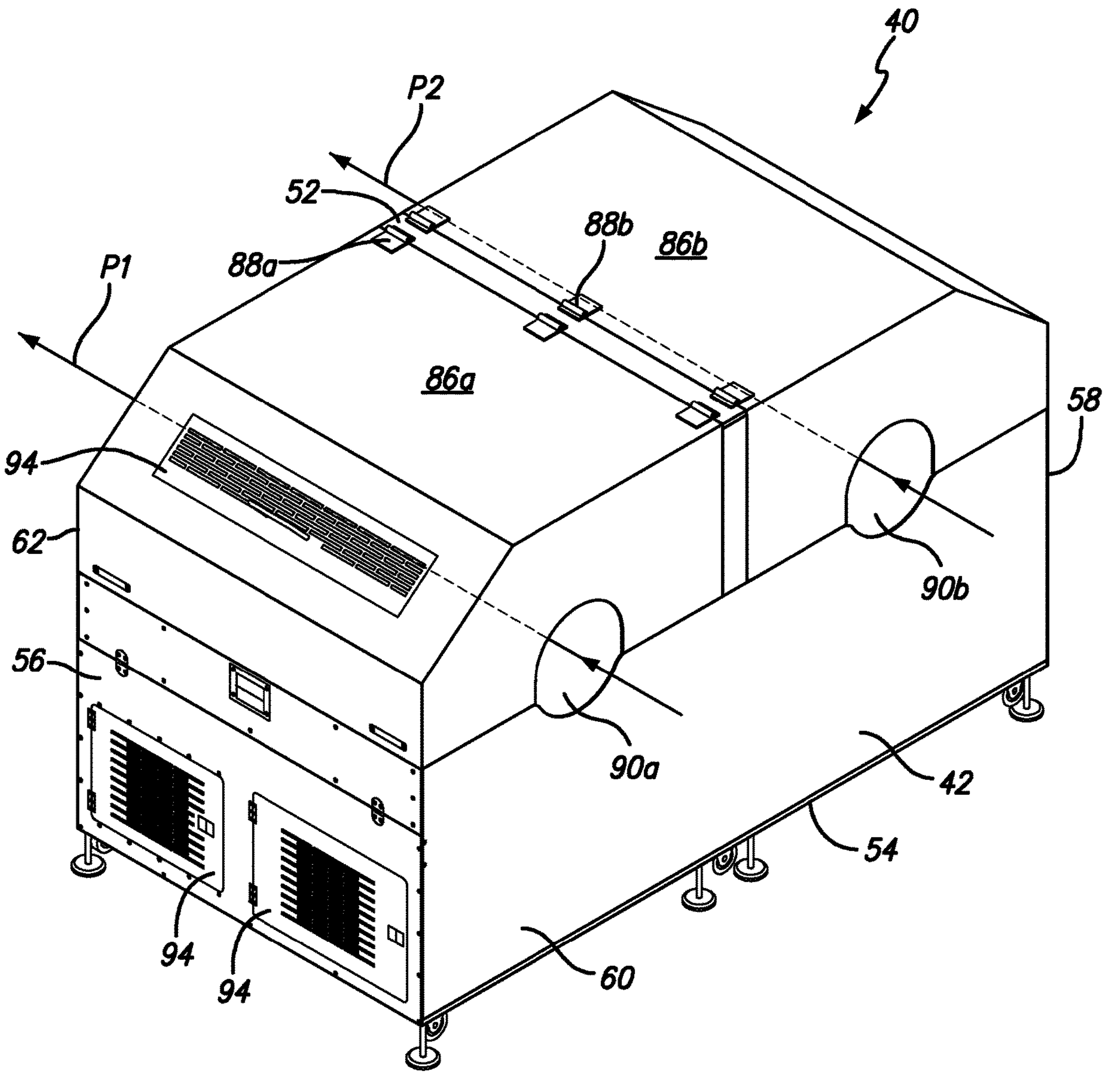
FIG. 10 is a perspective view of one of the dual tumble dryer units of FIG. 9.
Figure 11:
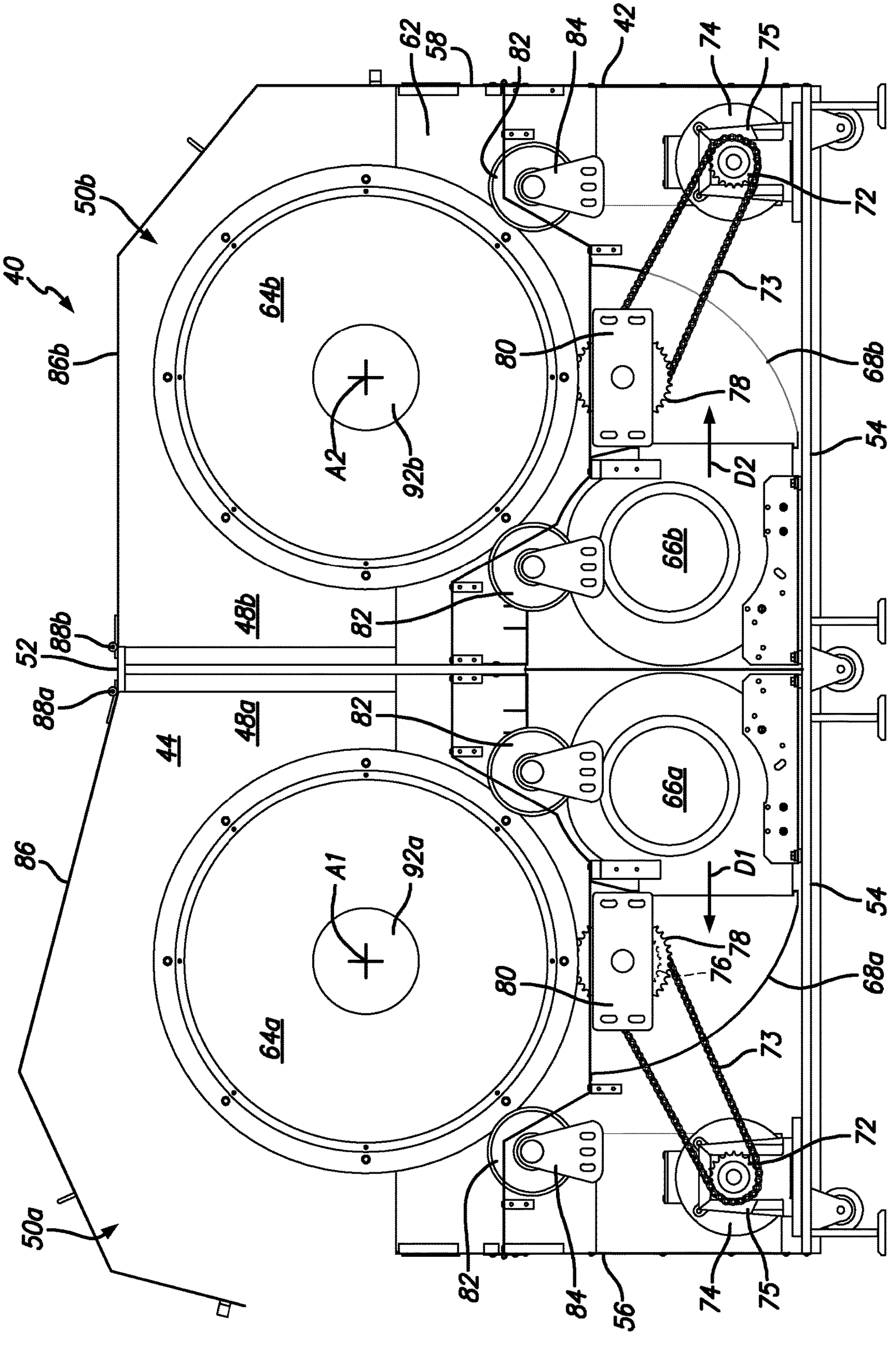
FIG. 11 is a cross-sectional side elevational view of the dual tumble dryer unit of FIG. 10.
Figure 12:
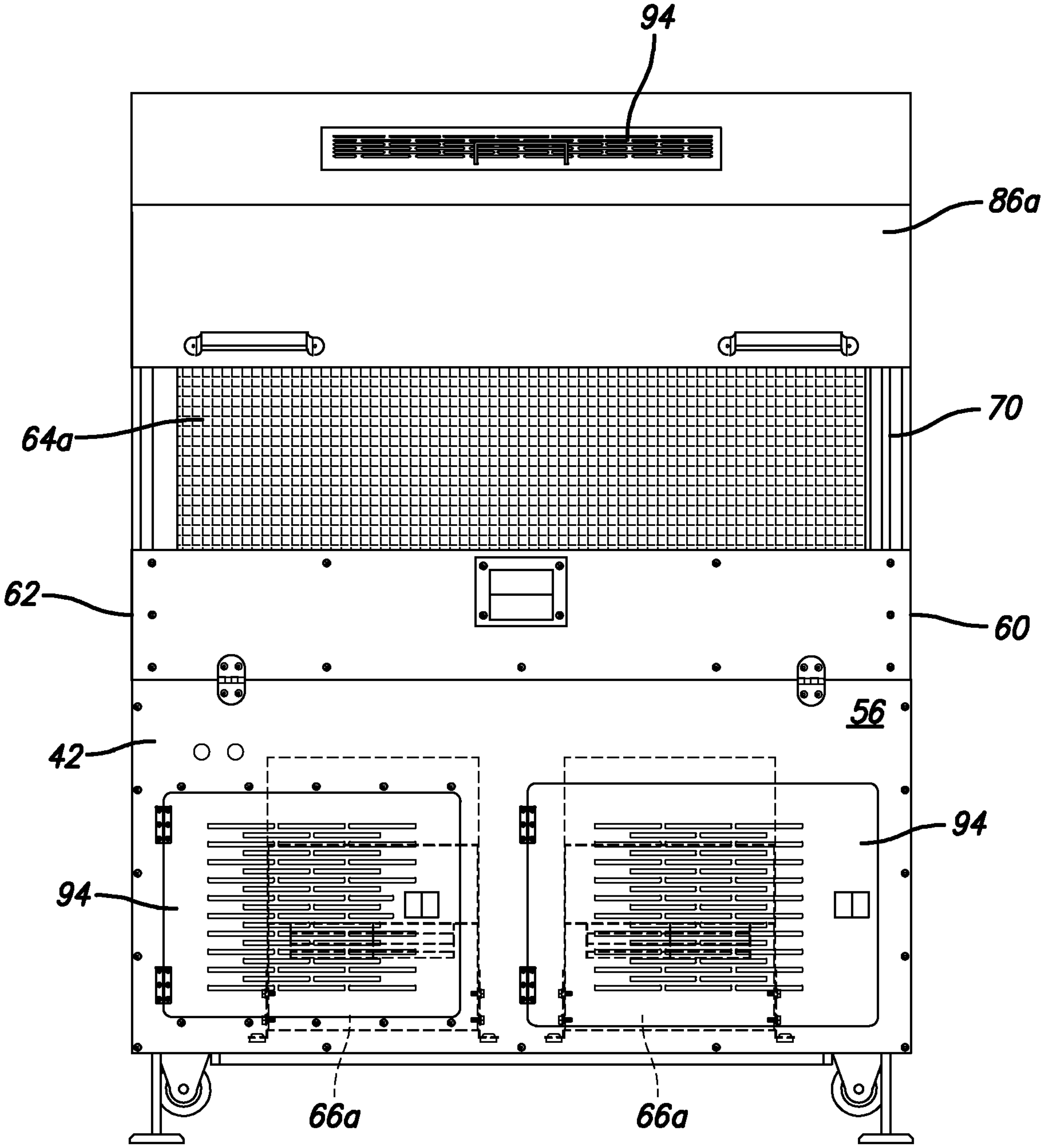
FIG. 12 is an end elevational view of the dual tumble dryer unit of FIG. 10 showing one of the covers partially open.

As shown in FIGS. 10-12, in a preferred, each tumble dryer is a dual tumble dryer unit 40 that provides the ability to run two batches of softgels through the tumble dryer line simultaneously. A tumble dryer unit 40 generally includes a housing 42 that defines a housing interior 44, a divider 46 that divides the housing interior 44 into first and second sections 48*a* and 48*b* that include first and second dryer assemblies 50*a* and 50*b*.

The housing 42 includes a top 52, a bottom 54, first and second opposing end walls 56 and 58, and first and second opposing side walls 60 and 62 that cooperate to define the housing interior 44. The divider 46 extends between the first and second side walls 60 and 62. The first dryer assembly 50*a* includes a first basket 64*a* positioned to rotate about a first axis A1 (which is preferably horizontal, but does not have to be), and a first blower 66*a* positioned to blow air on the first basket 64*a*. The second dryer assembly 50*b* includes a second basket 64*b* positioned to rotate about a second axis A2 (which is preferably horizontal, but does not have to be), and a second blower 66*b* positioned to blow air on the second basket 64*b*. The first and second dryer assemblies

50*a* and 50*b* include first and second ramps 68*a* and 68*b* that each direct air from the associated blower onto associated basket. In a preferred embodiment, the each section includes two blowers. In other words, in a preferred embodiment, the first section 48*a* includes two first blowers 66*a* (see FIG. 12) and the second section 48*b* includes two second blowers 66*b*).

As shown in FIG. 11, in a preferred embodiment, the first and second baskets 64*a* and 64*b* are each rotated by a first chain 70 and a plurality of gears. Each basket is preferably a wire mesh cylinder 71 wrapped with a second chain 73 at one end. The first chain 70 extends between a drive gear 72 (which is connected to an electric motor 74 and gearbox 75) and a first driven gear 76 that is coaxial with a second driven gear 78 that is engaged with the second chain 73 (or gear teeth) on the basket. As shown in FIG. 11, the second driven gear 78 is taller than the first driven gear 76. In operation, the drive gear 72 rotates the chain 70, which rotates the first driven gear 76, which rotates the second driven gear 78, which rotates the basket (64*a* or 64*b*). In a preferred embodiment, the first and second driven gears 76 and 78 are rotatably mounted on a bracket 80 that is secured to one of the first or second side walls 60 or 62. In a preferred embodiment, the first and second baskets 64*a* and 64*b* are rotatably supported on rollers 82 that are rotatably supported by brackets 84 that are secured to one of the first or second side walls 60 or 62.

As shown in FIG. 11, in a preferred embodiment, the first dryer assembly 50*a* is essentially a mirror image of the second dryer assembly 50*b*. With this arrangement, the first blower 66*a* is configured to blow air in a first direction D1, and the second blower 66*b* is configured to blow air in a second direction D2, which is opposite the second direction. In a preferred embodiment, the dual tumbler dryer unit 40 includes first and second covers 86*a* and 86*b* that are secured to the housing 42 by first and second hinges 88*a* and 88*b* respectively. It will be appreciated that the first and second hinges 88*a* and 88*b* can each be a single hinge unit or a plurality of axially aligned hinge units. The first and second covers 86*a* and 86*b* cover the first and second sections 48*a* and 48*b*, respectively. As shown in FIG. 11, in a preferred embodiment, the first and second hinges 88*a* and 88*b* are connected to the housing 42 near or on the divider 46 and adjacent to one another such that the first and second covers 86*a* and 86*b* open in an opposed manner.

As shown in FIG. 10, in a preferred embodiment, the dual tumble dryer unit 40 defines first and second drying paths P1 and P2. The first drying path P1 is defined between a first entry opening 90*a* defined in the first side wall 60, the first basket 64*a* and a first exit opening 92*a* defined in the second side wall 62. The second drying path P2 is defined between a second entry opening 90*b* defined in the first side wall 60, the second basket 64*b* and a second exit opening 92*b* defined in the second side wall 62. In a preferred embodiment, the first drying path P1 extends generally parallel to the first axis A1 and the second drying path P2 extends generally parallel to the second axis A2. It will be appreciated that individual softgels will not necessarily move in a straight direction, but will enter the entry opening, be tumbled and then exit the exit opening. However, the path of each softgel generally follows the direction of P1 or P2.

It will be appreciated that the dual tumbler dryer unit 40 includes scoops for moving the softgels from one dual tumbler dryer unit 40 to the adjacent dual tumbler dryer unit 40. The dual tumbler dryer units also preferably include the ability to reverse the rotation direction of the baskets. It will be appreciated that the dual tumble dryer unit 40 may include access doors 94 or the like for access to different areas of the interior. Hinges, handles, etc. can be used therewith.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description of the Preferred Embodiments using the singular or plural number may also include the plural or singular number respectively. The word "or" in reference to a list of two or more items, covers all of the following interpretations of the word: any of the items in the list, all of the items in the list, and any combination of the items in the list.

The above-detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed, at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference in their entirety. Aspects of the disclosure can be modified, if necessary, to employ the systems, functions, and concepts of the various references described above to provide yet further embodiments of the disclosure.

These and other changes can be made to the disclosure in light of the above Detailed Description of the Preferred Embodiments. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features or aspects of the disclosure with which that terminology is associated. In general, the terms used in the following claims should not be construed to limit the disclosures to the specific embodiments disclosed in the specification unless the above Detailed Description of the Preferred Embodiments section explicitly defines such terms. Accordingly, the actual scope of the disclosure encompasses not only the disclosed embodiments, but also all equivalent ways of practicing or implementing the disclosure under the claims.

Accordingly, although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A softgel drying system comprising:

a plurality of zones each comprising a dual tumble dryer and an air handler unit; wherein the plurality of zones are connected to connect the dual tumble dryer in each of the plurality of zones in series to pass softgels therethrough and each dual tumble dryer is configured to run two batches of softgels therethrough simultaneously;

wherein each air handler adjusts one or more of a temperature, a relative humidity, a dew point, and an airflow rate of air and directs air over the softgels moving through each dual tumble dryer;

wherein a beginning zone of the plurality of zones has a first air handler directing air at a first airflow rate, a first temperature in a range of about 50° F. to about 68° F., and a first relative humidity in a range of about 19% to about 23%; and wherein an intermediate zone between the beginning zone and an ending zone has a second air handler directing air at a second airflow rate, a second temperature, and a second relative humidity that is less than the first relative humidity;

wherein the second temperature is higher than the first temperature, and the second relative humidity is lower than the first relative humidity.

2. The system of claim 1, wherein the second airflow rate is in a range of about 2500 $ft^3$/min to about 5000 $ft^3$/min.

3. The system of claim 2, wherein the second temperature is in a range about 72° F. to about 87° F.

4. The system of claim 1, wherein the ending zone has a third air handler directing air at a third airflow rate that is less than the first airflow rate, a third temperature in a range of about 68° F. to about 74° F., and a third relative humidity that is less than the first relative humidity.

5. The system of claim 4, wherein the second temperature is in a range about 72° F. to about 87° F., and the first relative humidity is greater than both the second relative humidity and third relative humidity.

6. The system of claim 4, wherein the intermediate zone has a plurality of dual tumble dryers and has more tumble dryers than either of the beginning zone and the ending zone.

7. The system of claim 4, wherein the third relative humidity is in a range of about 10% to about 15%.

8. The system of claim 7, wherein the second relative humidity is in a range of about 9% to about 14%.

9. The system of claim 7, wherein the third airflow rate is in a range of about 1500 $ft^3$/min to about 2500 $ft^3$/min.

10. The system of claim 1, wherein each tumble dryer is a dual tumble dryer unit that runs two batches of softgels therethrough simultaneously.

* * * * *